US011831287B2

(12) United States Patent
Goyal et al.

(10) Patent No.: US 11,831,287 B2
(45) Date of Patent: Nov. 28, 2023

(54) COMMON MODE CORRECTION USING ADC IN ANALOG PROBE BASED RECEIVER

(71) Applicant: Faraday Technology Corp., Hsin-Chu (TW)

(72) Inventors: Prateek Kumar Goyal, Karnataka (IN); Raghu Nandan Chepuri, Karnataka (IN); Vinod Kumar Jain, Karnataka (IN)

(73) Assignee: Faraday Technology Corp., Hsin-Chu (TW)

( * ) Notice: Subject to any disclaimer, the term of this patent is extended or adjusted under 35 U.S.C. 154(b) by 176 days.

(21) Appl. No.: 17/531,811

(22) Filed: Nov. 22, 2021

(65) Prior Publication Data

US 2023/0163740 A1    May 25, 2023

(51) Int. Cl.
| | |
|---|---|
| *H04B 10/00* | (2013.01) |
| *H03G 3/30* | (2006.01) |
| *H04B 10/69* | (2013.01) |
| *H03M 1/12* | (2006.01) |
| *H03F 3/45* | (2006.01) |

(52) U.S. Cl.
CPC ............ *H03G 3/3084* (2013.01); *H03F 3/45* (2013.01); *H03M 1/12* (2013.01); *H04B 10/6933* (2013.01); *H03F 2200/375* (2013.01); *H03F 2203/45212* (2013.01)

(58) Field of Classification Search
CPC ... H03G 3/3084; H03F 3/45; H03F 2200/375; H03F 2203/45212; H03F 3/195; H03F 3/45385; H03F 3/45475; H03F 3/45744; H03M 1/12; H03M 1/1295; H04B 10/6933

See application file for complete search history.

(56) References Cited

U.S. PATENT DOCUMENTS

| | | | | |
|---|---|---|---|---|
| 5,295,161 A | * | 3/1994 | Dreps ............... | H04B 10/6933 327/563 |
| 6,018,407 A | * | 1/2000 | Hatakeyama ...... | H04B 10/6933 398/1 |
| 6,194,962 B1 | * | 2/2001 | Chen ................. | H03F 3/45766 330/253 |
| 6,696,894 B1 | * | 2/2004 | Huang .............. | H03F 3/45766 330/253 |
| 7,358,809 B2 | * | 4/2008 | Elder ................ | H03F 1/301 330/253 |

(Continued)

FOREIGN PATENT DOCUMENTS

TW    I587624 B    6/2017

*Primary Examiner* — Agustin Bello
(74) *Attorney, Agent, or Firm* — Winston Hsu

(57) ABSTRACT

A method for removing offset in a receiver of an integrated circuit (IC) includes: determining digital codes of differential input voltages of an amplifier in a first receiving lane of the receiver; comparing the digital codes to a digital code corresponding to an optimum common mode voltage (VCM) of the receiver; according to the comparison, determining a bias code for adjusting both the differential input voltages to match the optimum VCM; and inputting the bias code to a bias circuit of the receiver. The first receiving lane of the receiver includes a plurality of amplifiers. The method steps are repeated for each amplifier of the plurality of amplifiers, and then repeated for all receiving lanes of the IC.

26 Claims, 9 Drawing Sheets

(56) References Cited

U.S. PATENT DOCUMENTS

| | | | |
|---|---|---|---|
| 7,538,705 B2 | 5/2009 | Deval | |
| 8,289,077 B2 * | 10/2012 | Bruin | H03F 3/4521 |
| | | | 330/253 |
| 9,157,939 B2 | 10/2015 | Kain | |
| 10,498,461 B1 * | 12/2019 | Vera Villarroel | H03F 3/45475 |
| 10,720,919 B2 * | 7/2020 | Zhou | H03K 19/0185 |
| 11,088,719 B1 * | 8/2021 | Liu | H03F 3/45 |
| 11,139,789 B1 * | 10/2021 | Kusuda | H03F 3/393 |
| 11,558,013 B2 * | 1/2023 | Agarwal | H03F 1/0211 |
| 2003/0063020 A1 | 4/2003 | Masenas | |
| 2003/0154045 A1 | 8/2003 | Sung | |
| 2019/0327002 A1 * | 10/2019 | Foong | H04L 25/063 |
| 2020/0259485 A1 * | 8/2020 | Valencia | H04B 10/27 |
| 2021/0203290 A1 * | 7/2021 | Kim | H03F 3/45076 |
| 2021/0351752 A1 * | 11/2021 | Halbert | H03F 3/45475 |
| 2022/0128833 A1 * | 4/2022 | Moon | G02B 27/646 |
| 2022/0376718 A1 * | 11/2022 | Chen | H04B 17/13 |
| 2023/0032759 A1 * | 2/2023 | Haseeb | H03F 3/45475 |
| 2023/0084591 A1 * | 3/2023 | Micusik | H04Q 11/0001 |
| | | | 398/115 |
| 2023/0115601 A1 * | 4/2023 | Hsieh | H03M 1/468 |
| | | | 341/118 |
| 2023/0163740 A1 * | 5/2023 | Goyal | H03F 3/45744 |
| | | | 398/202 |

* cited by examiner

COMMON MODE CORRECTION USING ADC IN ANALOG PROBE BASED RECEIVER

BACKGROUND OF THE INVENTION

1. Field of the Invention

This invention is directed to common mode correction in an analog based receiver, and particularly to common mode correction in an analog based receiver using an analog to digital converter (ADC) that can correct for process, voltage and temperature (PVT) variations for all input modes of the receiver and across all lanes.

2. Description of the Prior Art

The input common mode voltage range of a circuit or component is the range of input voltages over which the circuit/component will function correctly when the same signal is applied to both input terminals. Receiver components such as sense amplifiers (SAs) and continuous time linear equalizers (CTLE) operate at a speed which is a function of the common mode voltage (VCM). The optimum VCM of these components is the input voltage at which they can achieve their best performance.

Due to variations in process/temperature/voltage (PVT), however, input signals of these components may vary with respect to the optimum VCM. Further, there may be an offset between the input signals themselves. Any common mode offset in the input signals of an amplifier will be magnified at the output due to the inherent gain of the component. This means that a following component will receive input signals with an even larger offset.

Various related art techniques exist for correcting or reducing the offset in a receiver. U.S. Pat. No. 10,931,381 teaches cancelling any differential offset in input signals which may be present due to errors in a reference voltage of the circuit. The corrected offset is then used to cancel offset in the output signal. The reference voltage itself is not calibrated, however, and may still vary due to PVT variations. Further, there may still be a large offset with respect to the optimum common mode voltage.

U.S. Pat. No. 9,780,737 takes a digital approach to correct any DC offset. As in the above prior art, the reference voltage is not calibrated, and this technique also fails to teach common mode calibration.

Refer to FIG. 1 which illustrates a standard integrated chip (IC) 100. As seen in the diagram, the IC has multiple receiving (Rx) lanes coupled to bias circuits. It is desirable that each lane behaves in a similar way such that there is little variation between the speeds of the signals therein. Even when offset within each lane is corrected using the corresponding bias circuit, fabrication differences mean that the DC operating point of each Rx lane may vary which will result in different operating speeds. In addition, different types of IC chips may have different performances. An FF Corner Chip, for example, typically has a low gain whereas an SS Corner Chip typically has a high gain and low bandwidth. Therefore, even when correcting for offsets within a chip, there will still be performance variations between different types of chips.

This in mind, there is a need for correcting common mode offset and PVT variations in a receiver which can also correct for variations in different types of chips as well as variations between lanes.

SUMMARY OF THE INVENTION

It is therefore an objective of the present application to provide a method for correcting offset within a receiver, wherein variations in inputs of individual components and variations in speed between different lanes can be corrected, and wherein the performance of the receiver can approach the performance of a receiver in a different type of chip.

A method for removing offset in a receiver of an integrated circuit (IC) comprises: determining digital codes of differential input voltages of an amplifier in a first receiving lane of the receiver; comparing the digital codes to a digital code corresponding to an optimum common mode voltage (VCM) of the receiver; according to the comparison, determining a bias code for adjusting both the differential input voltages to match the optimum. VCM; and inputting the bias code to a bias circuit of the receiver. These steps are all repeated for each amplifier in the first receiving lane of the receiver, and then repeated for all receiving lanes of the IC.

The digital codes of differential input voltages are determined by inputting all differential input voltages to an analog probe which is a multiplexer, and outputting each of the differential input voltages in sequence; inputting a first of the differential input voltages to a first input of a comparator; sequentially inputting a plurality of reference voltages to a second input of the comparator; and setting the first input differential input voltage as the currently input reference voltage when the output of the comparator toggles. Then, the first differential input voltage is input to the second input of the comparator; the plurality of reference voltages are sequentially input to the first input of the comparator; the second input differential input voltage is set as the currently input reference voltage when the output of the comparator toggles; and the final differential input voltage is set as the average of the set first input differential input voltage and the set second input differential input voltage.

The plurality of reference voltages may be generated according to a resistor ladder, and scaled according to a scaling factor. The scaling factor is determined by inputting a bandgap voltage to the comparator; and generating the scaling factor according to an offset in the comparator.

The bias code for adjusting both the differential input voltages to match the optimum VCM is determined by: when the digital codes of the differential input voltage are less than the digital code of the optimum VCM, increasing the bias code; and when the digital codes of the differential input voltage are greater than the digital code of the optimum VCM, decreasing the bias code. The method further comprises: determining digital codes of the bias adjusted differential input voltages of an amplifier in a first receiving lane of the receiver; comparing the digital codes to a digital code corresponding to the optimum common mode voltage (VCM) of the receiver; according to the comparison, adjusting the bias code; and inputting the adjusted bias code to the bias circuit of the receiver.

The step of inputting the bias code to the bias circuit of the receiver may be performed on-chip or off-chip.

An integrated circuit (IC) is further disclosed. The IC comprises a plurality of receiving lanes, each receiving lane comprising a plurality of amplifiers, and further comprises a circuit for removing offset comprising: an analog to digital converter (ADC) for determining digital codes of differential input voltages of an amplifier in a first receiving lane of the IC; and an ADC based adaptation algorithm circuit for comparing the digital codes to a digital code corresponding to an optimum common mode voltage (VCM) of the IC, determining a bias code according to the comparison for adjusting both the differential input voltages to match the optimum VCM, and inputting the bias code to a bias circuit of the receiver.

The ADC and ADC based adaptation algorithm circuit determine digital codes of differential input voltages and determine a bias code for each amplifier in the first receiving lane of the receiver, and further determine digital codes of differential input voltages and determine bias codes for all receiving lanes of the IC.

The circuit for removing offset further comprises an analog probe which is a multiplexer that receives all differential input voltages and outputs each of the differential input voltages in sequence. A first of the differential input voltages is input to a first input of the ADC, a plurality of reference voltages are input to a second input of the ADC, and the first input differential input voltage is set as the currently input reference voltage when the output of the ADC toggles. The first differential input voltage is then input to the second input of the ADC, the plurality of reference voltages are sequentially input to the first input of the ADC, the second input differential input voltage is set as the currently input reference voltage when the output of the ADC toggles, and the final differential input voltage is set as the average of the set first input differential input voltage and the set second input differential input voltage.

The IC further comprises a resistor ladder for generating the plurality of reference voltages. A bandgap voltage is input to the ADC to generate a scaling factor according to an offset in the ADC, and the plurality of reference voltages are scaled according to the scaling factor.

The ADC based adaption algorithm circuit increases the bias code when the digital codes of the differential input voltage are less than the digital code of the optimum VCM, and decreases the bias code when the digital codes of the differential input voltage are greater than the digital code of the optimum VCM.

The bias control may be performed on-chip or off-chip. The bias code either adjusts a source current or voltage of the amplifier, adjusts a diode size of a current mirror of the amplifier, or adjusts a tail current source of the amplifier.

These and other objectives of the present invention will no doubt become obvious to those of ordinary skill in the art after reading the following detailed description of the preferred embodiment that is illustrated in the various figures and drawings.

DETAILED DESCRIPTION

As detailed above, the prior art techniques aim to cancel the offset between differential inputs of a receiver, but do not correct the offset between the inputs and an optimum VCM or calibrate a reference voltage. This means that any remaining offset due to PVT variations will be magnified by each following component. The present invention therefore takes the approach of first determining an optimum VCM for each component within the receiver, comparing the differential inputs of each component with the optimum VCM, and determining an algorithm which biases each of the differential inputs to match the optimum VCM. In this way, in one step, both the differential offset and the VCM offset are corrected, as well as matching both inputs to the optimum VCM. In addition, the present invention calibrates reference voltages using the bandgap voltage as a golden reference for the entire IC.

Figure 1:
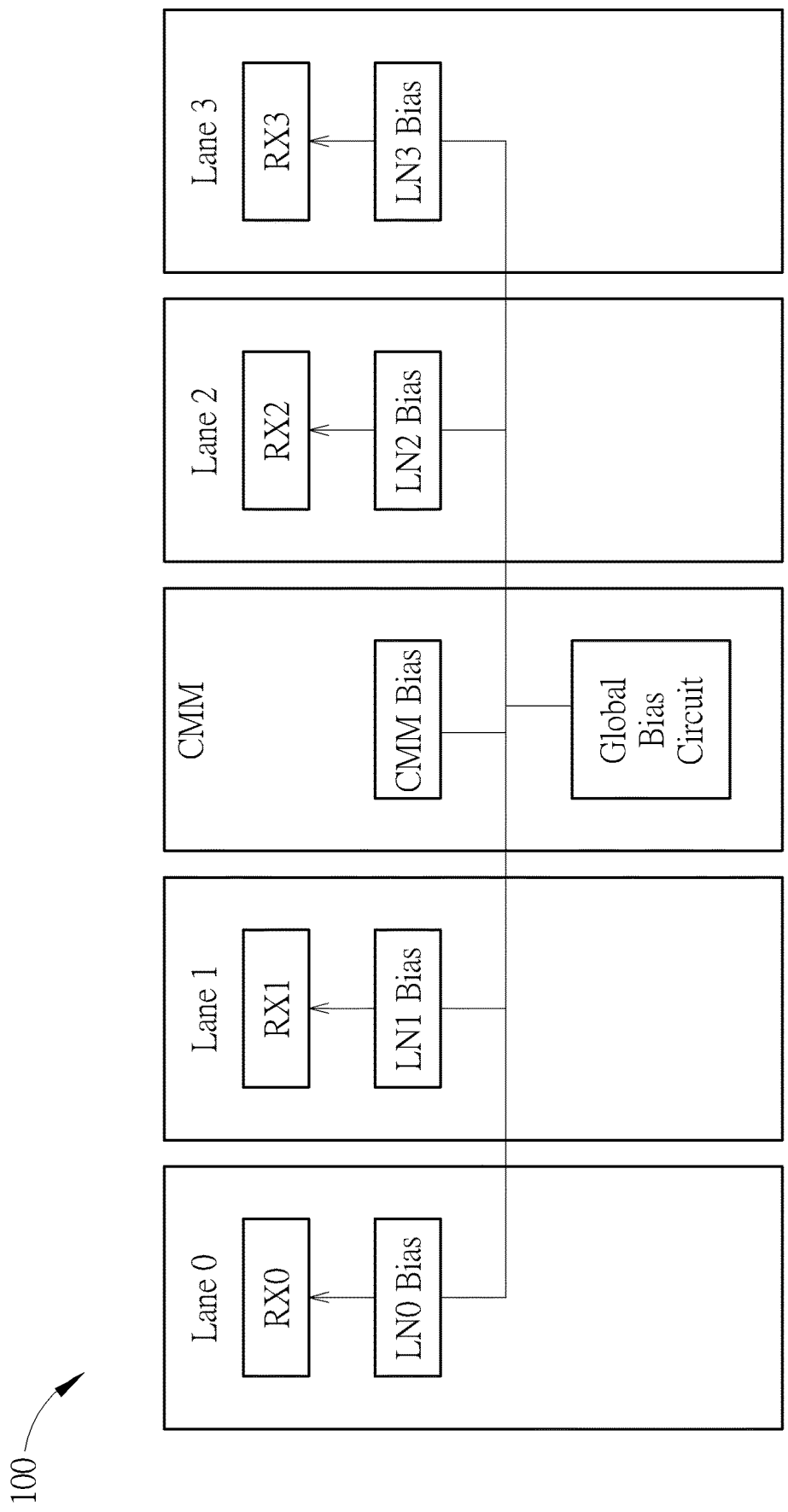
FIG. 1 is a diagram of the RX lanes of an IC chip.
Figure 2A:
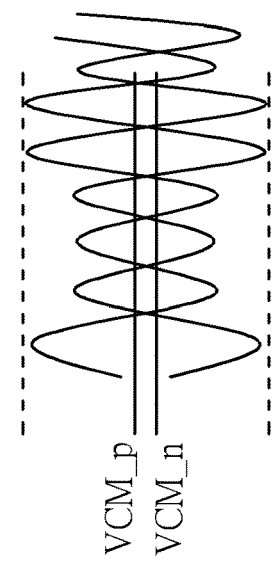
FIG. 2A is a diagram of correcting offset according to the prior art.
Figure 2A:
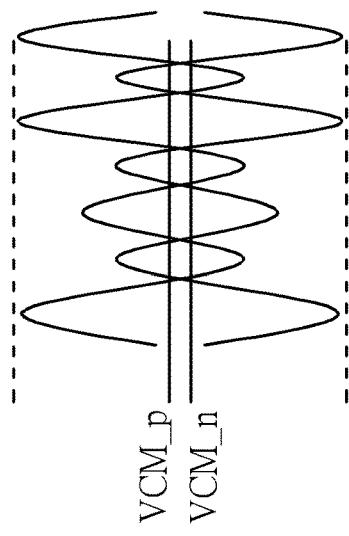
Figure 2A:
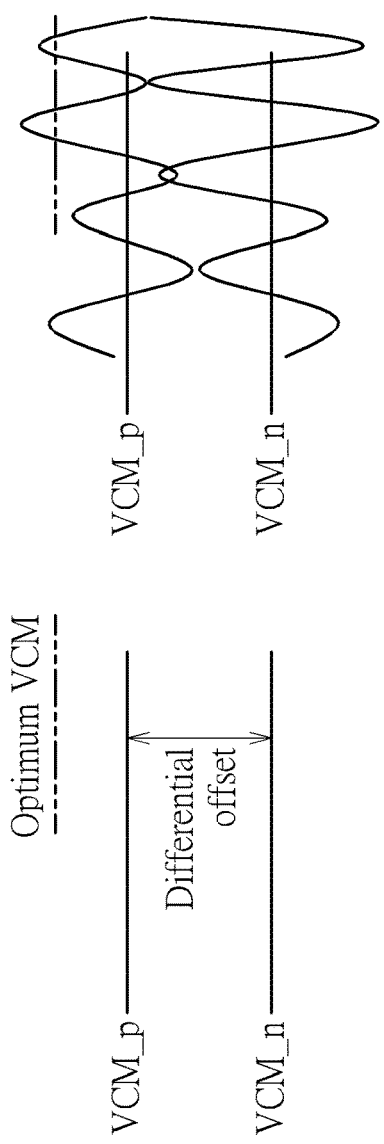

Refer to FIG. 2A which illustrates a technique of correcting offset according to the prior art. As shown in the left-hand side of the diagram, there is an offset between differential inputs VCM p and VCM n. Further, there is an offset between both these inputs and the optimum VCM. The middle diagram shows the effect this differential offset will have on the swing quality. The right-hand diagram shows the swing quality after the differential offset has been corrected. This may occur by moving VCM p down towards VCM n, moving VCM n up towards VCM p, or moving both VCM p and VCM n towards each other.

Figure 2B:
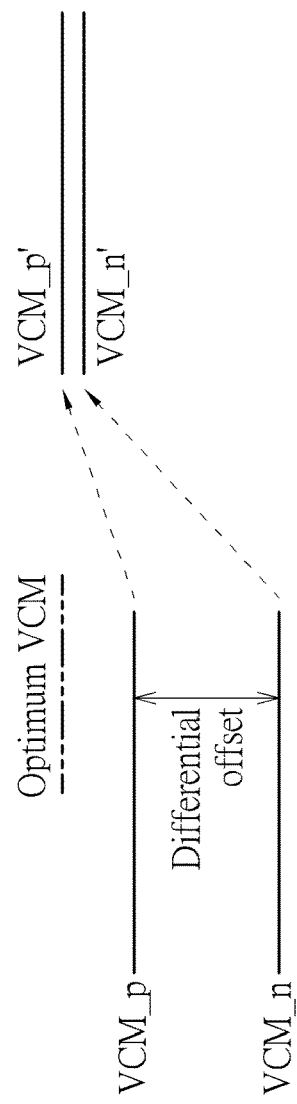
FIG. 2B is a diagram of correcting offset according to an exemplary embodiment of the present invention.

FIG. 2B illustrates a technique of correcting offset according to the present invention. The left hand side of the diagram shows the same differential offset and VCM offset as in FIG. 2A. The middle diagram shows that each input is moved towards the optimum VCM, which also corrects the differential offset. The right hand side of the diagram shows the effect on the swing quality. As compared with FIG. 2A, it can be seen that the swing/gain is larger because the differential inputs are operating at or close to the optimum VCM.

Figure 3:
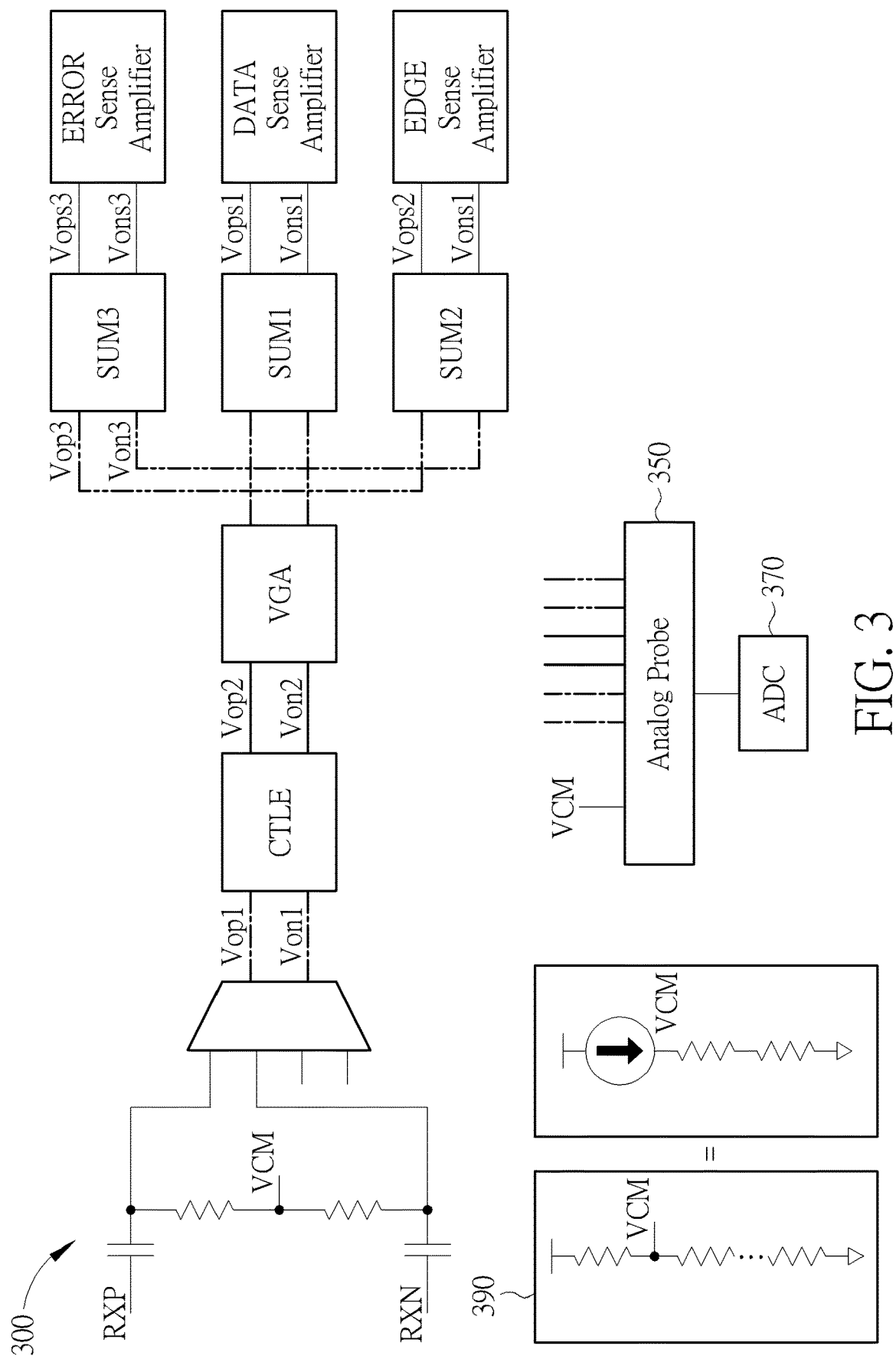
FIG. 3 is a diagram of an IC chip including a circuit for generating a common mode voltage and generating a digital code according to the present invention.

Refer to FIG. 3, which illustrates a receiver 300 according to an exemplary embodiment of the present invention. As shown in the diagram, the receiver 300 comprises a number of components including sense amplifiers and CTLEs. As detailed in the background, any offset present at the input of a component will be magnified at the output due to gain. The present invention therefore corrects offset for all input signals by inputting them in turn to an analog probe 350, which can be implemented by a multiplexer. The analog probe 350 is coupled to an ADC 370 for generating digital codes corresponding to each input signal. An ADC/resistor ladder 390 is illustrated for generating the VCM and the reference voltages, although these voltages can be generated in many ways and the resistor ladder is merely one example.

The VCM is the optimum VCM at which each component operates. By generating the digital code of the optimum VCM, a digital code of the average of the input signals and comparing the two, an offset can be determined and used to generate an algorithm which is used to bias the corresponding component for removing said offset. The analog probe 350 is also used to first determine any inherent offset in the resistor ladder 390 and generate a scaling factor for correcting said offset.

Figure 4:
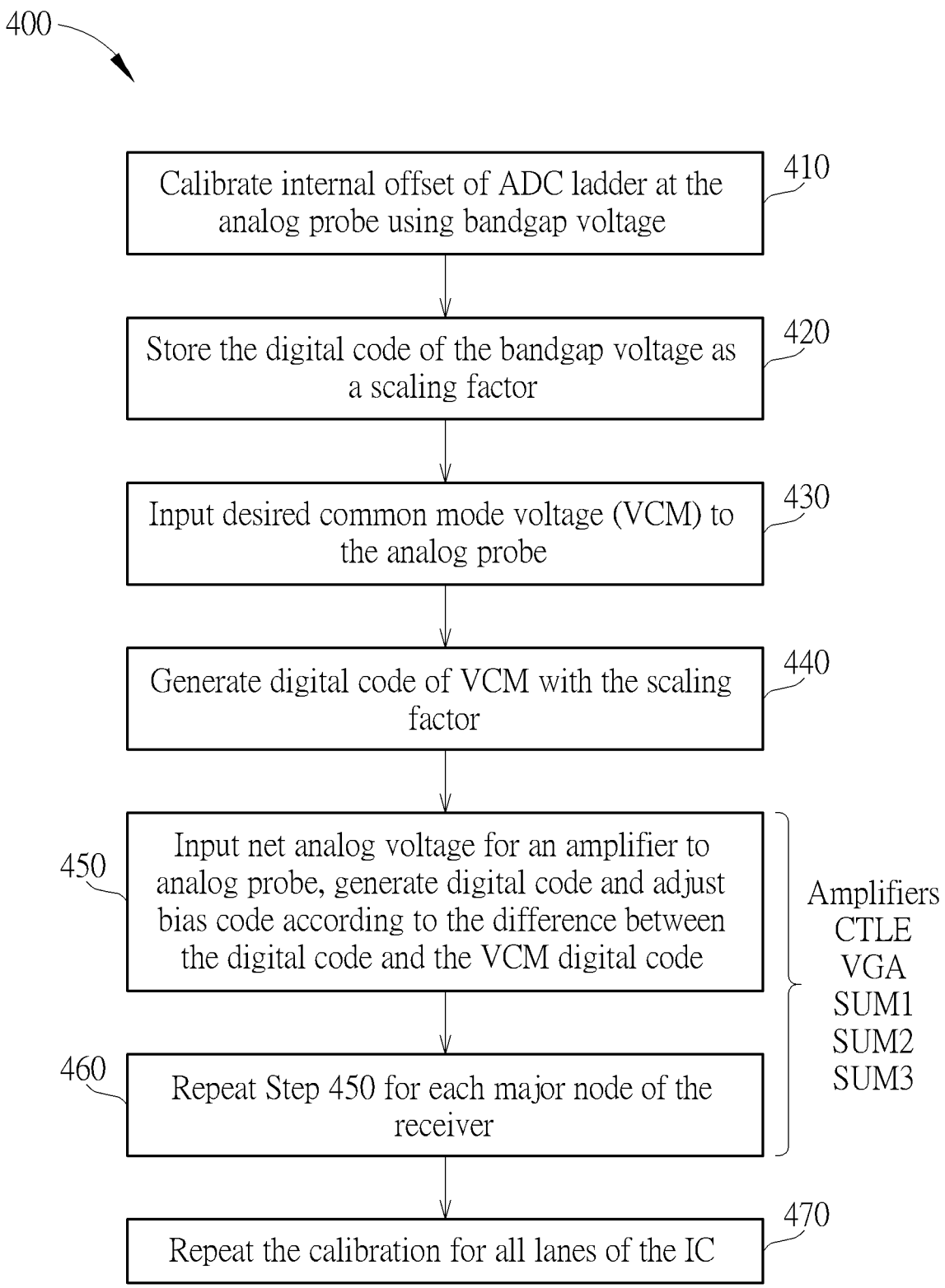
FIG. 4 is a flowchart of correcting offset according to the present invention.

FIG. 4 illustrates a method 400 of the present invention. Initially, a bandgap voltage is used to calibrate the ADC ladder 390. As the bandgap voltage is a PVT independent voltage, it can be used as a golden reference for generating a scaling factor.

The optimum VCM is then input to the analog probe. A corresponding digital code is generated, and scaled using the bandgap voltage digital code. The analog probe can then receive all differential inputs for each component, and generate corresponding digital codes which are also scaled with scaling factor. By comparing the digital codes for each pair of differential inputs with the digital code for the optimum VCM, a bias code can be generated for each component. These steps are then repeated for each lane of the receiver.

The steps of the method 400 are shown below:
Step 410: Calibrate internal offset of ADC ladder at the analog probe using bandgap voltage;
Step 420: Store the digital code of the bandgap voltage as a scaling factor;
Step 430: Input desired common mode voltage (VCM) to the analog probe;
Step 440: Generate digital code of VCM with the scaling factor;
Step 450: Input net analog voltage for an amplifier to analog probe, generate digital code and adjust bias code according to the difference between the digital code and the VCM digital code;
Step 460: Repeat Step 450 for each major node of the receiver; Step 470: Repeat the calibration for all lanes of the IC.

Figure 5:
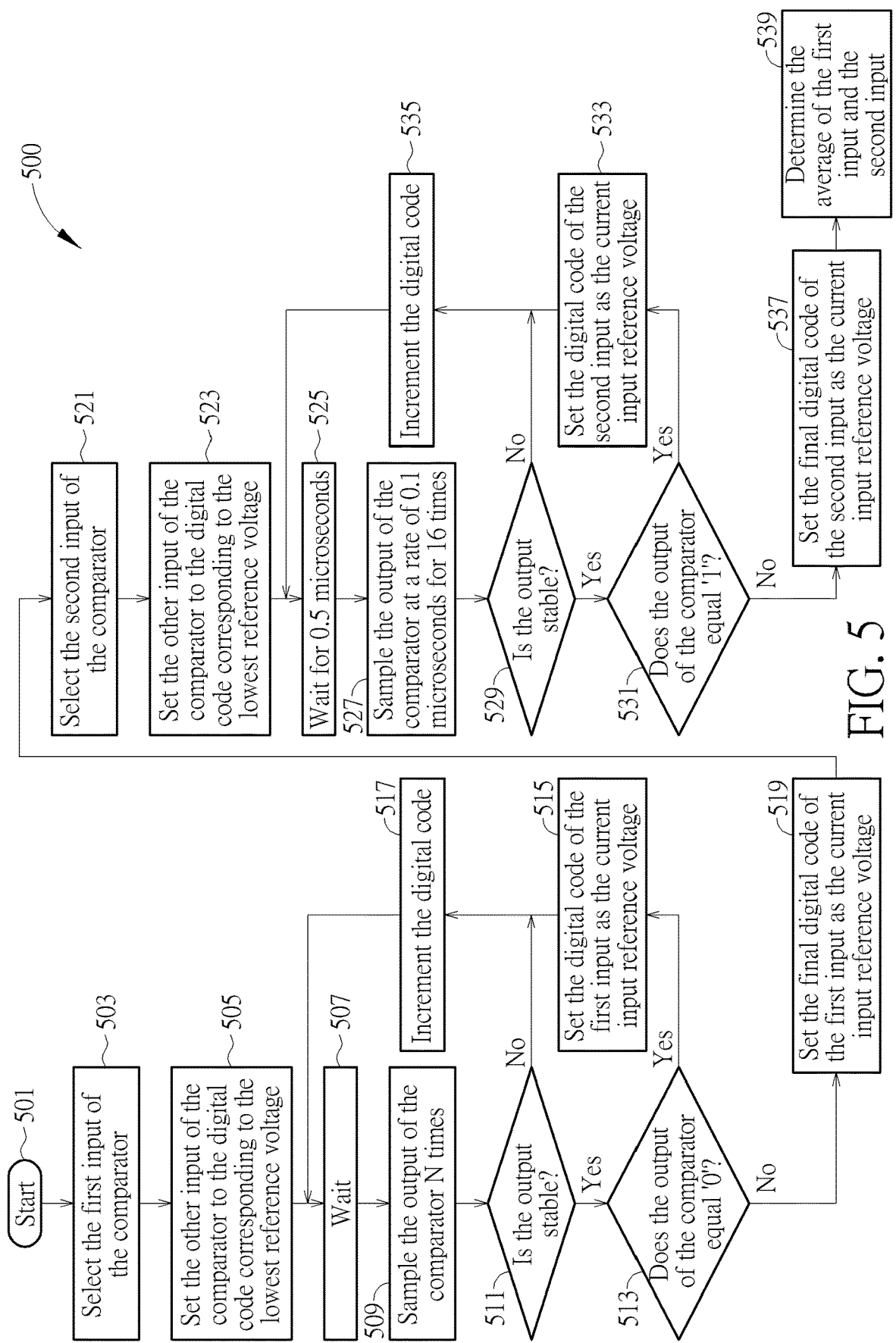
FIG. 5 is a flowchart of generating digital codes according to the present invention.

FIG. 5 is a flowchart 500 showing how digital code is generated for each input signal. The ADC 350 comprises a comparator which receives a first signal on a first input and a reference signal (generated by the resistor ladder 390) on the second input. When the output of the comparator switches (i.e. from '0' to '1' or from '1' to '0'), this means that the first input matches the reference signal. The inputs are then switched in order to cancel out any inherent offset. Initially, the first input is selected to receive the input signal and the second input receives a reference signal, which is initially the lowest reference. The output is sampled a number of times. When the output is stable, it is then determined whether the output equals a digital '0'. If so, the digital code (reference code) is incremented, and the same comparison step is performed. Once the output toggles to a digital '1', the other input is tested to cancel out any inherent offset between the inputs of the ADC. Once the digital codes for each input are determined, an average between them is determined to determine the final digital code output.

The steps are as follows:
Step 501: Start;
Step 503: Select the first input of the comparator;
Step 505: Set the other input of the comparator to the digital code corresponding to the lowest reference voltage;
Step 507: Wait;
Step 509: Sample the output of the comparator N times;
Step 511: Is the output stable? If yes, go to Step 513; if no, go to Step 517;
Step 513: Does the output of the comparator equal '0'? If yes, go to Step 515; if no, go to Step 519;
Step 515: Set the digital code of the first input as the current input reference voltage
Step 517: Increment the digital code and return to Step 507;
Step 519: Set the final digital code of the first input as the current input reference voltage;
Step 521: Select the second input of the comparator; Step 523: Set the other input of the comparator to the digital code corresponding to the lowest reference voltage;
Step 525: Wait for 0.5 microseconds;
Step 527: Sample the output of the comparator at a rate of 0.1 microseconds for 16 times;
Step 529: Is the output stable? If yes, go to Step 531; if no, go to Step 533;
Step 531: Does the output of the comparator equal '1'? If yes, go to Step 533; if no, go to Step 537;
Step 533: Set the digital code of the second input as the current input reference voltage;
Step 535: Increment the digital code and return to Step 525;
Step 537: Set the final digital code of the second input as the current input reference voltage;
Step 539: Determine the average of the final digital code of the first input and the final digital code of the second input.

Figure 6:
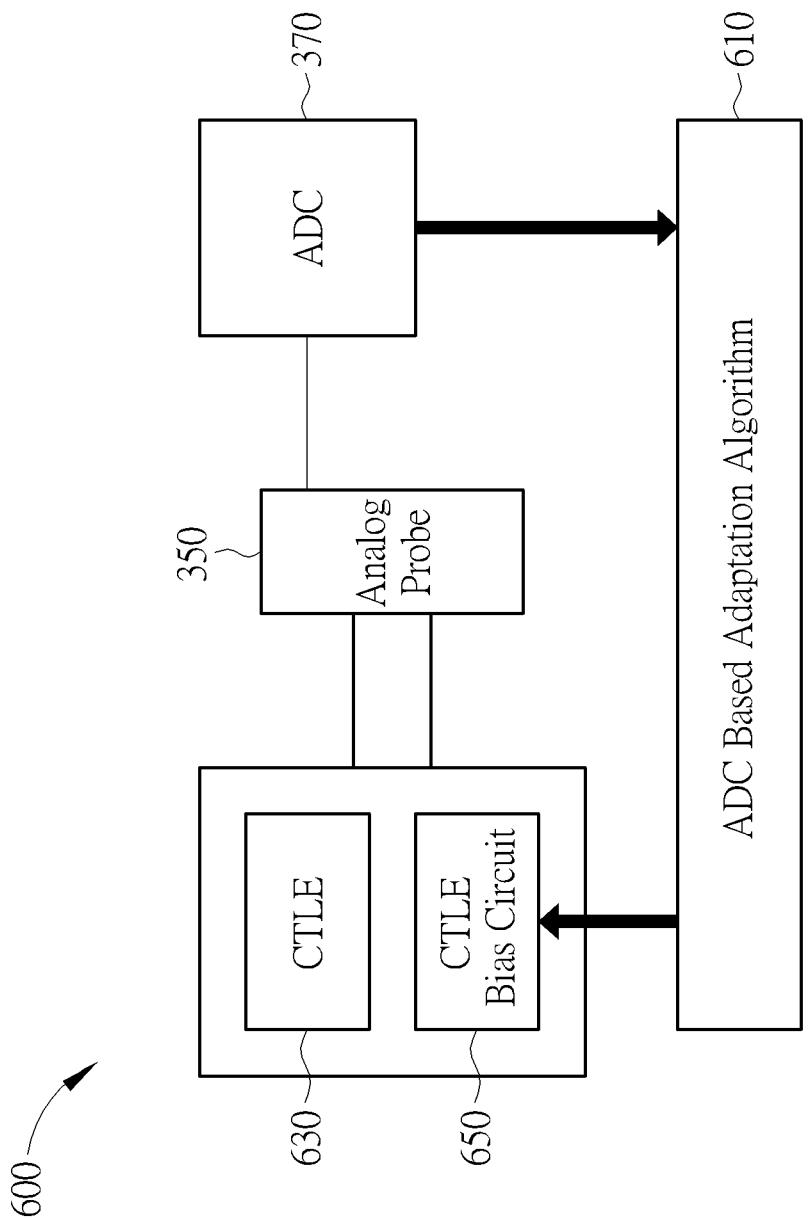
FIG. 6 is a circuit diagram of generating and adjusting a bias code for the IC chip shown in FIG. 3.

Once the digital codes of all inputs have been determined, these codes can be compared with the digital code of the optimum VCM for determining an algorithm which can be used to bias each component. FIG. 6 is a circuit diagram 600 for correcting bias for a single component. Correction is carried out for each component individually so that any remaining offset is not passed on to a following component. FIG. 6 illustrates a CTLE 630 and a CTLE bias circuit 650. The inputs of the CTLE 630 are input to the analog probe 350, which is coupled to the ADC 370. The ADC 30 generates a digital code of the inputs, as shown in FIG. 5. The resultant code is input to the ADC based Adaptation algorithm circuit 610 which compares the differential code of the inputs to the optimum VCM digital code, and generates a code/algorithm which is then used to bias the CTLE. This algorithm moves each differential input towards the optimum VCM, which also removes the differential offset between the inputs.

Figure 7:
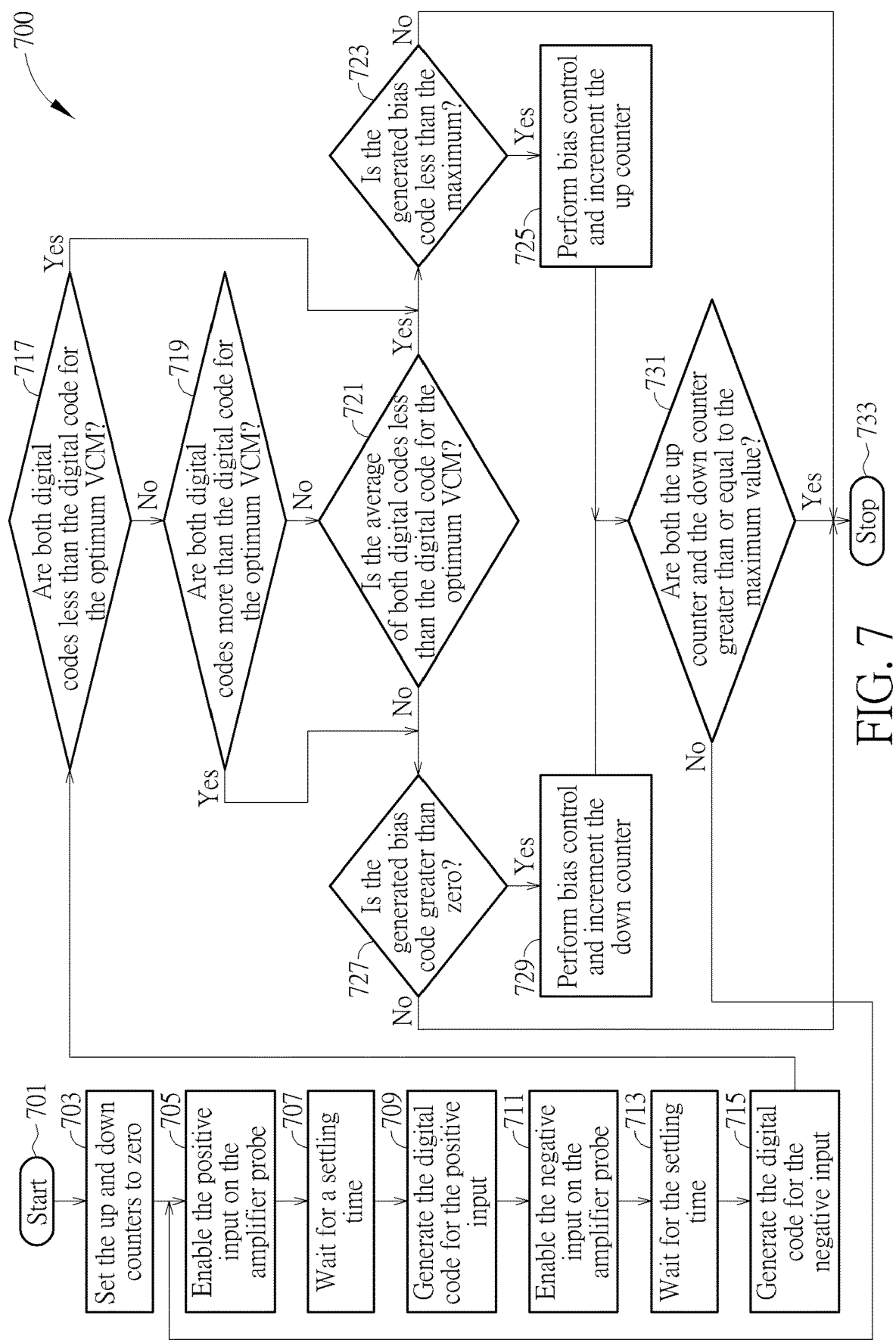
FIG. 7 is a flowchart of generating and adjusting a bias code according to the present invention.

FIG. 7 is a detailed flowchart 700 of the above process. Up and down counters in the ADC 370 are initialized, and the first input for the analog probe is turned on and allowed to settle. The digital code for this input is generated as shown in FIG. 5. Then the second input for the analog probe is turned on and allowed to settle, and the digital code is generated. Each input code is compared with the optimum VCM. In a first step, it is determined whether both input codes are less than the optimum VCM. If so, it is determined whether any bias control code which has been generated is less than the maximum code. If not, i.e. the bias control code has already reached the maximum and the inputs cannot be increased any more to approach the optimum VCM, then the flow ends. If the bias control is less than the maximum code, the bias code is incremented up, which also increments the up counter.

When neither input code is less than the reference code, it is then determined if both codes are greater than the reference code. If yes, it is determined whether the bias code is greater than zero. When the bias code is not greater than zero, this means that the inputs cannot be decreased any more to approach the optimum VCM and the flow ends. When the bias code is greater than zero, the bias control code can be decreased/incremented down, which also increments the down counter.

After incrementing the up or down counter (i.e. after incrementing or decrementing the bias code), it is determined whether the up counter and down counter have both reached their maximum count, i.e. has the bias code been increased and decreased. This is to make sure that any noisy region has been passed. If so, the flow ends. If not, the bias-corrected input signals are input to the analog probe 350 once more.

When both digital codes are neither greater than nor less than the digital code for the optimum VCM, the flow 700 determines whether an average of both digital codes is less than the digital code for the optimum VCM. If yes, the method determines whether the generated bias code is less than the maximum; if no, the method determines whether the generated bias code is greater than zero.

The steps of the method 700 are shown as follows:
Step 701: Start;
Step 703: Set the up and down counters to zero;
Step 705: Enable the positive input on the amplifier probe;
Step 707: Wait for a settling time;
Step 709: Generate the digital code for the positive input;
Step 711: Enable the negative input on the amplifier probe;
Step 713: Wait for the settling time;
Step 715: Generate the digital code for the negative input;
Step 717: Are both digital codes less than the digital code for the optimum VCM? If yes, go to Step 723; if no, go to Step 719;
Step 719: Are both digital codes more than the digital code for the optimum VCM? If yes, go to Step 727; if no, go to Step 721;
Step 721: Is the average of both digital codes less than the digital code for the optimum VCM? If yes, go to Step 723; if no, go to Step 727;
Step 723: Is the generated bias code less than the maximum bias code? If yes, go to Step 725; if no, go to Step 733;
Step 725: Perform bias control and increment the up counter; go to Step 731;
Step 727: Is the generated bias code greater than zero? If yes, go to Step 729; if no, go to Step 733;
Step 729: Perform bias control and increment the down counter;
Step 731: Have both the up counter and the down counter reached their maximum value? If no, go back to Step 705; if yes, go to Step 733;
Step 733: Stop.

Figure 8:
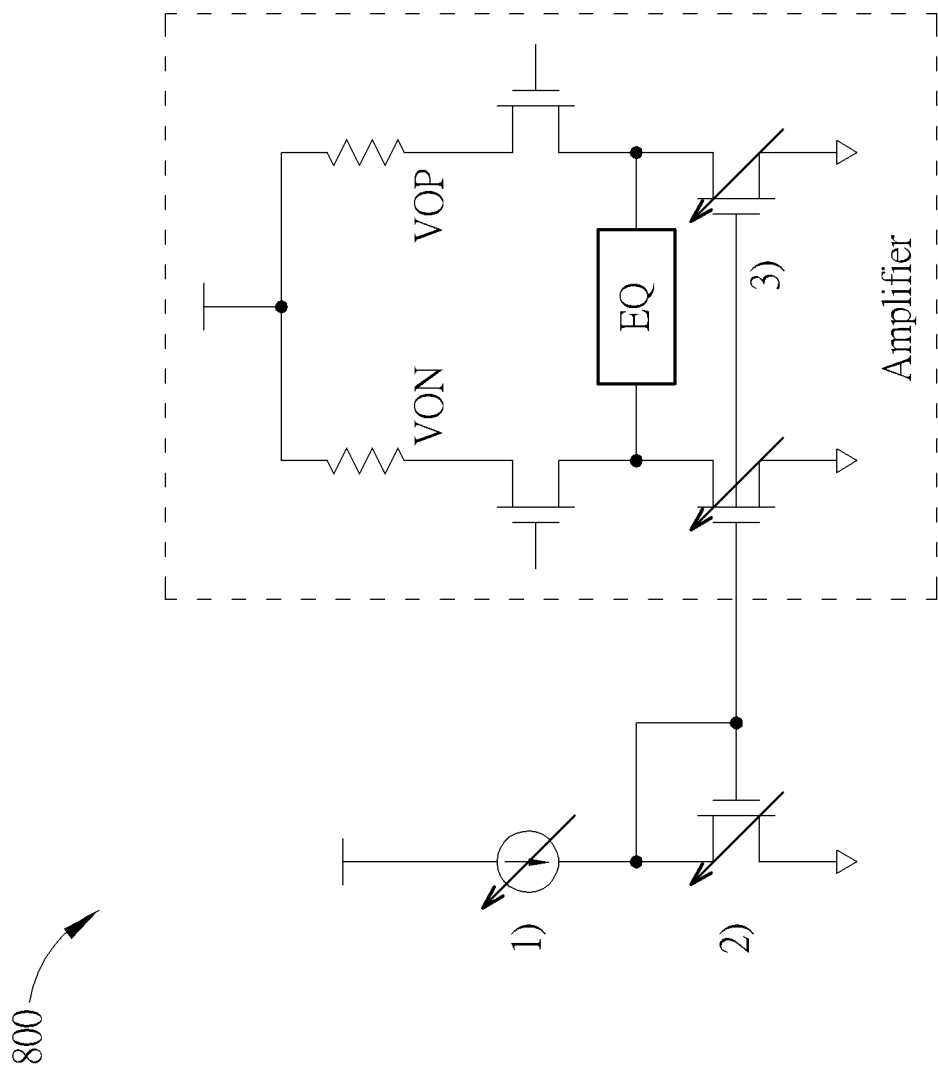
FIG. 8 is a diagram of correcting bias in the present invention.

FIG. 8 shows how the bias control can be implemented within each component (for example, within a sense amplifier of the circuit 300). The bias control can be implemented in a number of ways. In a first embodiment, the bias control can be implemented by biasing the source current or voltage (indicated by numeral 1). In a second embodiment, the bias control can be implemented by biasing the destination diode size (indicated by numeral 2). In a third embodiment, the bias control can be implemented by biasing the destination tail current source (indicated by numeral 3).

Figure 9A:
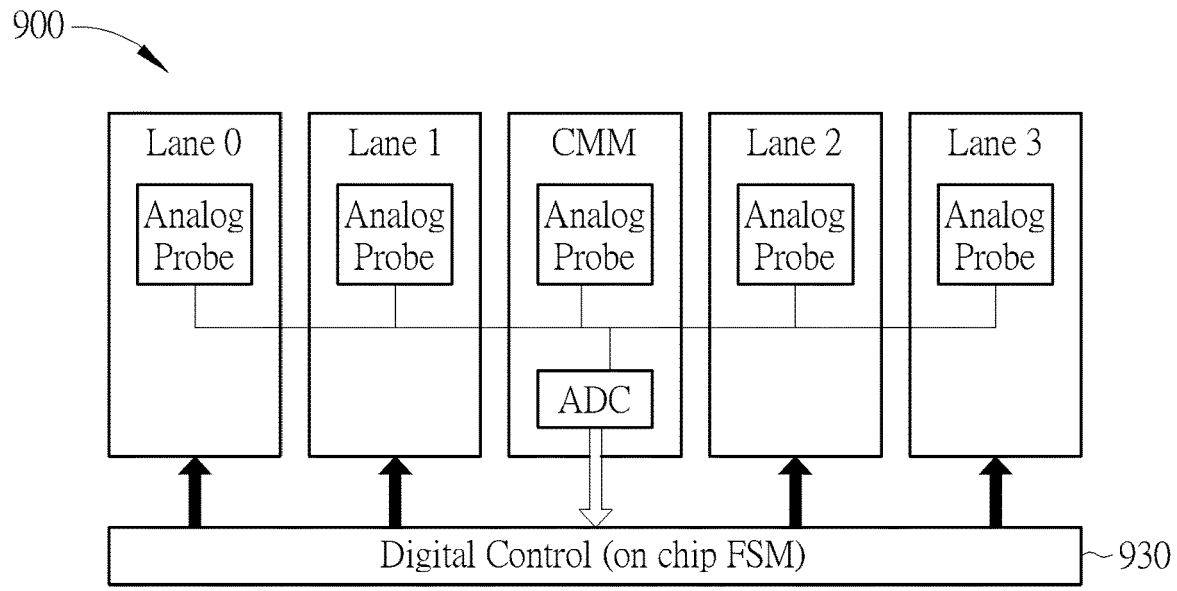
FIG. 9A is a diagram of an on-chip method of correcting bias.
Figure 9B:
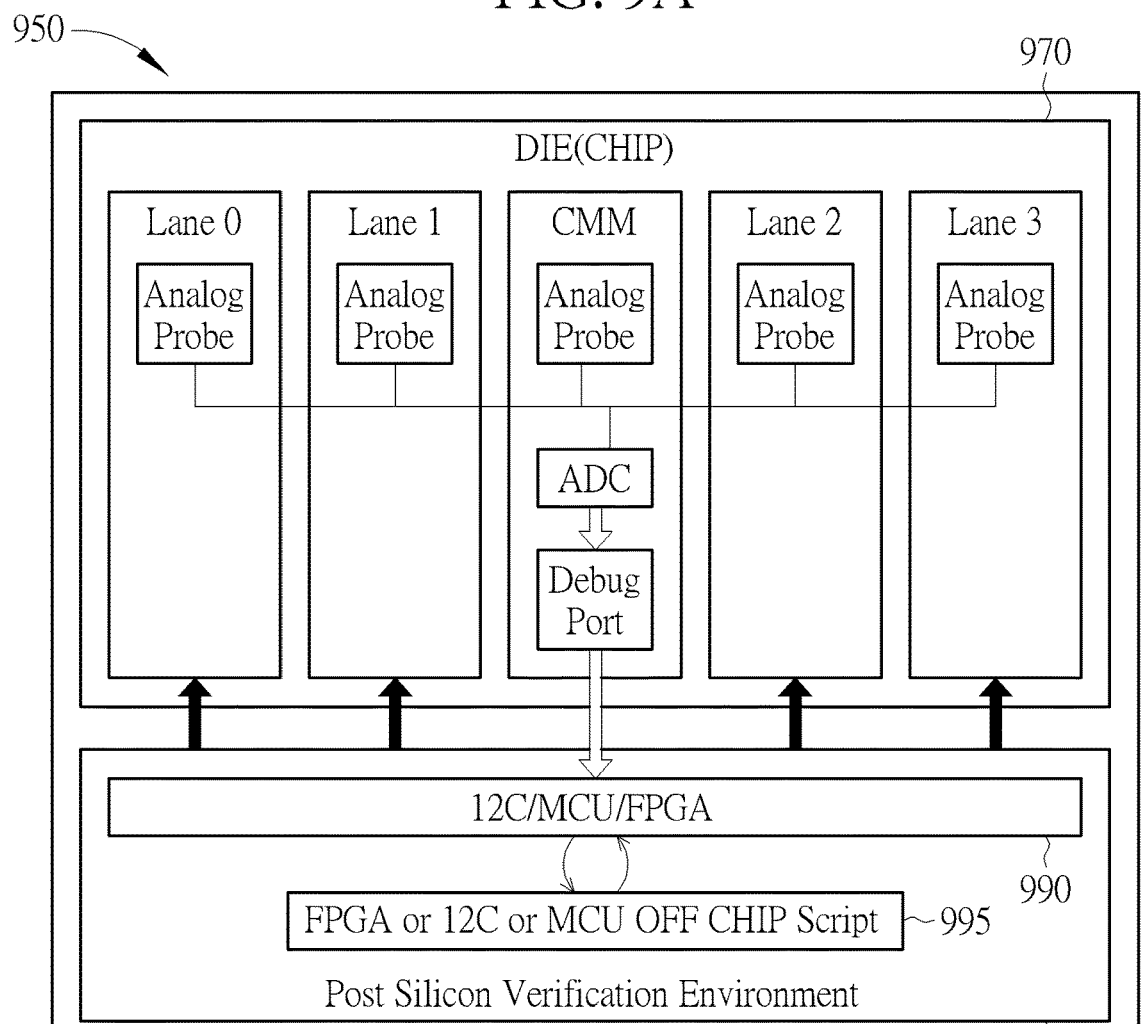
FIG. 9B is a diagram of an off-chip method of correcting bias.

The bias control can either be performed on-chip or off-chip, as illustrated in FIG. 9A and FIG. 9B, respectively. As shown in FIG. 9A, a digital control circuit 930 is coupled to all receiving lanes of an IC 900. Each receiving lane contains an analog probe which operates as detailed in the above explanation. The common mode (CMM) lane also includes an ADC which is coupled to all of the analog probes, and provides comparison results to the digital control circuit 930, which can then bias each lane.

FIG. 9B illustrates an IC 970, which is coupled to a post silicon verification environment 980. By placing both components on a testing board 950, the ADC in the common mode lane can output comparison results via a debug port to the post silicon verification environment 980, which then inputs bias control to each lane.

In summary, the method and circuit of the present invention provide means for bias control in a receiver which can reduce offset with respect to an optimum common mode voltage. The present invention can also calibrate the offset across all lanes of the receiver, and further calibrate the offset for different chips.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method for removing offset in an integrated circuit (IC), comprising:
    determining digital codes of differential input voltages of an amplifier in a first receiving lane of the IC, the first receiving lane of the IC comprising a plurality of amplifiers;
    comparing the digital codes to a digital code corresponding to an optimum common mode voltage (VCM) of the IC;
    according to the comparison, determining a bias code for adjusting both the differential input voltages to match the optimum VCM; and
    inputting the bias code to a bias circuit of the IC.
2. The method of claim 1, further comprising:
    repeating all steps of the method for each amplifier of the plurality of amplifiers in the first receiving lane of the IC.
3. The method of claim 2, further comprising:
    repeating all steps of the method for all receiving lanes of the IC.
4. The method of claim 1, wherein the digital codes of differential input voltages are determined by:
    inputting all differential input voltages to an analog probe which is a multiplexer, and outputting each of the differential input voltages in sequence;
    inputting a first of the differential input voltages to a first input of a comparator;
    sequentially inputting a plurality of reference voltages to a second input of the comparator; and
    setting the first input differential input voltage as the currently input reference voltage when the output of the comparator toggles.
5. The method of claim 4, further comprising:
    inputting the first differential input voltage to the second input of the comparator;
    sequentially inputting the plurality of reference voltages to the first input of the comparator;
    setting the second input differential input voltage as the currently input reference voltage when the output of the comparator toggles; and
    setting the final differential input voltage as the average of the set first input differential input voltage and the set second input differential input voltage.
6. The method of claim 4, wherein the plurality of reference voltages are generated according to a resistor ladder.
7. The method of claim 6, further comprising:
    inputting a bandgap voltage to the comparator;
    generating a scaling factor according to an offset in the comparator; and
    scaling the plurality of reference voltages according to the scaling factor.

8. The method of claim 1, wherein the step of determining a bias code for adjusting both the differential input voltages to match the optimum VCM comprises:
when the digital codes of the differential input voltage are less than the digital code of the optimum VCM, increasing the bias code;
when the digital codes of the differential input voltage are greater than the digital code of the optimum VCM, decreasing the bias code;
and the method further comprises:
determining digital codes of the bias adjusted differential input voltages of the amplifier in a first receiving lane of the receiver;
comparing the digital codes to a digital code corresponding to the optimum common mode voltage (VCM) of the receiver;
according to the comparison, adjusting the bias code; and
inputting the adjusted bias code to the bias circuit of the receiver.

9. The method of claim 3, wherein the step of inputting the bias code to the bias circuit of the IC is performed on-chip.

10. The method of claim 3, wherein the step of inputting the bias code to the bias circuit of the IC is performed off-chip.

11. The method of claim 1, wherein the bias code adjusts a source current or voltage of the amplifier.

12. The method of claim 1, wherein the bias code adjusts a diode size of a current mirror of the amplifier.

13. The method of claim 1, wherein the bias code adjusts a tail current source of the amplifier.

14. An integrated circuit (IC) comprising a plurality of receiving lanes, each receiving lane comprising a plurality of amplifiers, and a circuit for removing offset comprising:
an analog to digital converter (ADC) for determining digital codes of differential input voltages of an amplifier in a first receiving lane of the IC; and
an ADC based adaptation algorithm circuit for comparing the digital codes to a digital code corresponding to an optimum common mode voltage (VCM) of the IC, determining a bias code according to the comparison for adjusting both the differential input voltages to match the optimum VCM, and inputting the bias code to a bias circuit of the receiver.

15. The IC of claim 14, wherein the ADC and ADC based adaptation algorithm circuit determine digital codes of differential input voltages and determine a bias code for each amplifier of the plurality of amplifiers in the first receiving lane of the receiver.

16. The IC of claim 15, wherein the ADC and ADC based adaptation algorithm circuit determine digital codes of differential input voltages and determine the bias codes for all receiving lanes of the IC.

17. The IC of claim 14, wherein the circuit for removing offset further comprises an analog probe which is a multiplexer that receives all differential input voltages and outputs each of the differential input voltages in sequence;
wherein a first of the differential input voltages is input to a first input of the ADC, a plurality of reference voltages are input to a second input of the ADC, and the first input differential input voltage is set as the currently input reference voltage when the output of the ADC toggles.

18. The IC of claim 17, wherein the first differential input voltage is input to the second input of the ADC, the plurality of reference voltages are sequentially input to the first input of the ADC, the second input differential input voltage is set as the currently input reference voltage when the output of the ADC toggles, and the final differential input voltage is set as the average of the set first input differential input voltage and the set second input differential input voltage.

19. The IC of claim 17, further comprising a resistor ladder for generating the plurality of reference voltages.

20. The IC of claim 19, wherein a bandgap voltage is input to the ADC to generate a scaling factor according to an offset in the ADC, and the plurality of reference voltages are scaled according to the scaling factor.

21. The IC of claim 14, wherein the ADC based adaption algorithm circuit increases the bias code when the digital codes of the differential input voltage are less than the digital code of the optimum VCM, and decreases the bias code when the digital codes of the differential input voltage are greater than the digital code of the optimum VCM.

22. The IC of claim 16, wherein the bias control is performed on-chip.

23. The IC of claim 16, wherein the bias control is performed off-chip.

24. The IC of claim 14, wherein the bias code adjusts a source current or voltage of the amplifier.

25. The IC of claim 14, wherein the bias code adjusts a diode size of a current mirror of the amplifier.

26. The IC of claim 14, wherein the bias code adjusts a tail current source of the amplifier.

* * * * *